United States Patent
Park

(10) Patent No.: US 9,834,705 B2
(45) Date of Patent: Dec. 5, 2017

(54) POLISHING SLURRY AND METHOD OF POLISHING SUBSTRATE USING THE SAME

(71) Applicant: UBMATERIALS INC., Yongin-Si, Gyeonggi-do (KR)

(72) Inventor: Jin Hyung Park, Ulsan (KR)

(73) Assignee: UBMATERIALS INC. (KR)

( * ) Notice: Subject to any disclaimer, the term of this patent is extended or adjusted under 35 U.S.C. 154(b) by 0 days.

(21) Appl. No.: 15/047,624

(22) Filed: Feb. 18, 2016

(65) Prior Publication Data

US 2016/0251547 A1 Sep. 1, 2016

(30) Foreign Application Priority Data

Feb. 27, 2015 (KR) .................. 10-2015-0028173

(51) Int. Cl.
*C09K 13/06* (2006.01)
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
USPC ........................................................ 252/79.4
See application file for complete search history.

(56) References Cited

U.S. PATENT DOCUMENTS

| | | | |
|---|---|---|---|
| 6,066,787 A | 5/2000 | Potgeiter | |
| 6,068,787 A * | 5/2000 | Grumbine | C09G 1/02 216/88 |
| 2010/0248593 A1* | 9/2010 | Sakai | C03C 19/00 451/36 |
| 2012/0028466 A1* | 2/2012 | McConnell | B24B 37/044 438/692 |

FOREIGN PATENT DOCUMENTS

| | | |
|---|---|---|
| CN | 102225874 A | 10/2011 |
| JP | 10265766 A | 10/1998 |
| JP | 2001152135 A | 6/2001 |
| JP | 2006049479 A | 2/2006 |
| JP | 201073953 A | 4/2010 |
| JP | 2012134358 A | 7/2012 |
| JP | 2014205851 A | 10/2014 |
| KR | 20040035074 A | 4/2004 |
| KR | 100948814 | 3/2010 |
| KR | 101409889 B1 | 6/2014 |
| TW | 467794 B | 12/2001 |
| WO | 2016039265 A1 | 3/2016 |

* cited by examiner

*Primary Examiner* — Roberts Culbert
(74) *Attorney, Agent, or Firm* — Renaissance IP Law Group LLP

(57) ABSTRACT

Provided are a slurry for polishing tungsten and a method of polishing a substrate. The slurry according to an exemplary embodiment includes an abrasive configured to perform polishing and include particles having a positive zeta potential, a dispersant configure to disperse the abrasive, an oxidizer configured to oxidize a surface of the tungsten, a catalyst configured to promote oxidation of the tungsten, and a selectivity control agent configured to control a polishing selectivity and include an organic acid containing a carboxyl group. According to the slurry of the exemplary embodiment, a polishing selectivity between the tungsten and the insulation layer may be improved by suppressing a polishing rate of the insulation layer.

19 Claims, 6 Drawing Sheets

FIG. 6

| ABRASIVE $ZrO_2$ (wt%) | DISPERSANT PAA-BASED (wt%) | CATALYST $NH_4FeSO_4$ (wt%) | OXIDIZER $H_2O_2$ (wt%) | SELECTIVITY CONTROL AGENT Malic acid (wt%) | pH | W POLISHING RATE [Å/min] | $SiO_2$ POLISHING RATE [Å/min] | SELECTIVITY |
|---|---|---|---|---|---|---|---|---|
| 1.0 | 0.375 | 0.05 | 1.5 | 0 | 2.3 | 5913.43 | 159.6 | 37 |
| | | | | 0.01 | | 5482.90 | 140.6 | 39 |
| | | | | 0.1 | | 5044.31 | 102.0 | 49 |
| | | | | 1 | | 4175.37 | 47.77 | 87 |
| | | | | 3 | | 3152.35 | 22.13 | 142 |
| | | | | 5 | | 2797.64 | 18.5 | 151 |
| | | | | 10 | | 1809.41 | 18.3 | 99 |

POLISHING SLURRY AND METHOD OF POLISHING SUBSTRATE USING THE SAME

CROSS-REFERENCE TO RELATED APPLICATION

This application claims priority to Korean Patent Application No. 10-2015-0028173 filed on Feb. 27, 2015 and all the benefits accruing therefrom under 35 U.S.C. §119, the contents of which are incorporated by reference in their entirety.

TECHNICAL FIELD

The present disclosure relates to a polishing slurry, and more particularly, to a polishing slurry which may be used for the planarization of tungsten by a chemical mechanical polishing process in a semiconductor manufacturing process and a method of polishing a substrate using the same.

BACKGROUND ART

In line with the fact that the size of a semiconductor device has been gradually reduced and the number of layers of metal interconnections has been gradually increased, surface irregularities in each layer are transferred to the next layer, and thus, a curvature of the lowermost surface becomes important. The curvature may have a significantly effect to such a degree that it may be difficult to perform a photolithography process in the next step. Thus, in order to improve the yield of the semiconductor device, a planarization process for removing the curvature of irregular surfaces, which occur in various process steps, is essentially used. There are various planarization methods such as a method of reflowing after the formation of a thin film, a method of etching back after the formation of a thin film, and a method of chemical mechanical polishing (CMP).

A chemical mechanical polishing process denotes a process of smoothly polishing a surface of a semiconductor wafer by providing a slurry containing an abrasive and various compounds while the surface of the semiconductor wafer is in contact with a polishing pad and is subjected to a rotational motion. That is, the chemical mechanical polishing process denotes that a substrate or a surface of a top layer of the substrate is planarized by being chemically and mechanically polished by the slurry and the polishing pad. In general, it is known that a process of forming a metal oxide ($MO_x$) by an oxidizer and a process of removing the formed metal oxide with an abrasive repeatedly occur in a metal polishing process.

A polishing process of a tungsten layer, which is widely used as an interconnection of the semiconductor device, is also performed by a mechanism in which a process of forming a tungsten oxide ($WO_3$) by an oxidizer and a potential control agent and a process of removing the tungsten oxide with an abrasive are repeated. Also, an insulation layer or a pattern, such as a trench, may be formed under the tungsten layer. In this case, a high polishing selectivity between the tungsten layer and the insulation layer is required in the polishing process. That is, a slurry, which does not polish the insulation layer while well polishing the tungsten layer, is required.

Thus, in order to improve the polishing selectivity of tungsten to the insulation layer, various components have been added to the slurry or the amounts of the oxidizer and catalyst contained in the slurry have been controlled. However, in spite of these efforts, a slurry for polishing tungsten, which exhibits a high polishing selectivity, has not been developed so far.

In Korean Patent Registration No. 10-0948814, a slurry for polishing tungsten is proposed in which polishing is performed in two steps, but, in this case, the process may be complicated and productivity may be reduced.

DISCLOSURE OF THE INVENTION

Technical Problem

The present disclosure provides a slurry for polishing tungsten and a method of polishing a substrate using the same.

The present disclosure also provides a slurry, which may improve a polishing selectivity by adjusting polishing rates of tungsten and a material other than the tungsten, and a method of polishing a substrate using the same.

Technical Solution

In accordance with an exemplary embodiment, a slurry for polishing tungsten includes: an abrasive configured to perform polishing and include particles having a positive zeta potential; a dispersant configured to disperse the abrasive; an oxidizer configured to oxidize a surface of the tungsten; a catalyst configured to promote oxidation of the tungsten; and a selectivity control agent configured to control a polishing selectivity and include an organic acid containing a carboxyl group.

The abrasive may include zirconium oxide particles and may be included in an amount of approximately 0.1 wt % to approximately 10 wt % based on a total weight of the slurry, and the abrasive may also be included in an amount of approximately 0.4 wt % to approximately 3 wt % based on the total weight of the slurry.

The dispersant may be included in an amount of approximately 0.01 wt % to approximately 5 wt % based on the total weight of the slurry, and the dispersant may also be included in an amount of approximately 0.15 wt % to approximately 1 wt % based on the total weight of the slurry. The oxidizer may be included in an amount of approximately 0.5 wt % to approximately 10 wt % based on the total weight of the slurry, and the oxidizer may also be included in an amount of approximately 1.0 wt % to approximately 5.0 wt % based on the total weight of the slurry. The catalyst may be included in an amount of approximately 0.001 wt % to approximately 5 wt % based on the total weight of the slurry, and the catalyst may be included in an amount of approximately 0.01 wt % to approximately 1 wt % based on the total weight of the slurry.

The selectivity control agent may be included in an amount of approximately 0.1 wt % to approximately 10 wt % based on the total weight of the slurry, and the selectivity control agent may also be included in an amount of approximately 1 wt % to approximately 10 wt % based on the total weight of the slurry. Also, the selectivity control agent may generate a negatively charged functional group in an acidic region. The selectivity control agent may have a pKa value, which is an index representing a degree to which hydrogen ions are dissociated in a carboxyl group, of less than approximately 7, may have the plurality of pKa values, and may have 3 or more pKa values. Furthermore, the selectivity control agent may include at least one of acetic acid, maleic acid, succinic acid, citric acid, oxalic acid, malic acid, or malonic acid.

In accordance with another exemplary embodiment, a slurry for polishing tungsten includes: zirconium oxide particles as an abrasive configured to perform polishing; and a selectivity control agent configured to control a polishing selectivity between the tungsten and a material other than the tungsten, wherein the selectivity control agent includes an acid which is dissociated in an acidic region to generate a $COO^-$ functional group.

Herein, the material other than the tungsten may include an insulation material, and the $COO^-$ functional group may be adsorbed to at least one of the insulation material and the abrasive to suppress polishing of the insulation layer.

The slurry may further include an oxidizer configured to oxidize a surface of the tungsten; and a catalyst configured to promote oxidation of the tungsten, wherein, in an acidic region, the tungsten in an oxidized state may be negatively charged, the insulation material may be positively charged, and the $COO^-$ functional group may be adsorbed to the insulation layer.

Also, the slurry may further include a pH adjuster, wherein a pH value may be adjusted to a range of approximately 2 to approximately 4.

In accordance with yet another exemplary embodiment, a method of polishing a substrate, as a method which may be used in the preparation of various devices, such as semiconductor devices, includes: preparing a substrate on which a tungsten layer is formed; preparing a slurry which includes zirconium oxide particles as an abrasive and a selectivity control agent containing a carboxyl group; and polishing the tungsten layer while supplying the slurry to the substrate, wherein, in the polishing, a functional group, which is generated by dissociation of the carboxyl group, suppresses polishing of a material other than the tungsten layer.

In this case, the slurry may be prepared by including an oxidizer configured to oxidize a surface of the tungsten layer, or the oxidizer may be added to and mixed with the slurry before the slurry is supplied to the substrate.

The preparing of the substrate, on which the tungsten layer is formed, includes: forming an insulation layer with a material other than the tungsten on the substrate; forming a trench in the insulation layer; and forming a tungsten layer on an entire surface of the insulation layer including the trench.

The polishing may be performed in an acidic pH region, and the polishing may include: forming a tungsten oxide layer on a top surface of the tungsten layer and polishing the tungsten oxide layer with the abrasive; and generating a $COO^-$ group by dissociation of the carboxyl group.

Also, the polishing may include: exposing the insulation layer to be positively charged; and suppressing polishing of the insulation layer by adsorbing the $COO^-$ group to the insulation layer.

The polishing may include: allowing the abrasive to be positively charged and exposing the insulation layer to be negatively charged; and suppressing polishing of the insulation layer by adsorbing the $COO^-$ group to the abrasive.

Advantageous Effects

According to an exemplary embodiment, a polishing rate of a material other than tungsten, e.g., an insulation layer, may be suppressed by using a slurry in which a functional group is controlled by a selectivity control agent. Since the polishing rate of the insulation layer is suppressed, a polishing selectivity between the tungsten and the insulation layer may be improved.

Also, erosion may be reduced by using the slurry having a high selectivity, and dishing may be suppressed by using zirconia abrasive particles. That is, in a case in which a tungsten layer is polished by using the slurry according to the exemplary embodiment, dishing as well as erosion may be reduced and the generation of a byproduct may be reduced.

According to an exemplary embodiment, since the polishing selectivity is high, excessive polishing of the tungsten and the insulation layer may be suppressed, and the tungsten may be efficiently polished by a simple polishing process. Thus, polishing productivity may be improved.

Furthermore, defects, such as dishing and erosion, may be reduced and the generation of the byproduct may be suppressed. Thus, overall manufacturing productivity as well as operating characteristics and reliability of a subsequently-manufactured semiconductor device may be improved.

BRIEF DESCRIPTION OF THE DRAWINGS

FIG. 6 is a table showing results of polishing by using the slurry of the exemplary embodiment;

MODE FOR CARRYING OUT THE INVENTION

Figure 1:
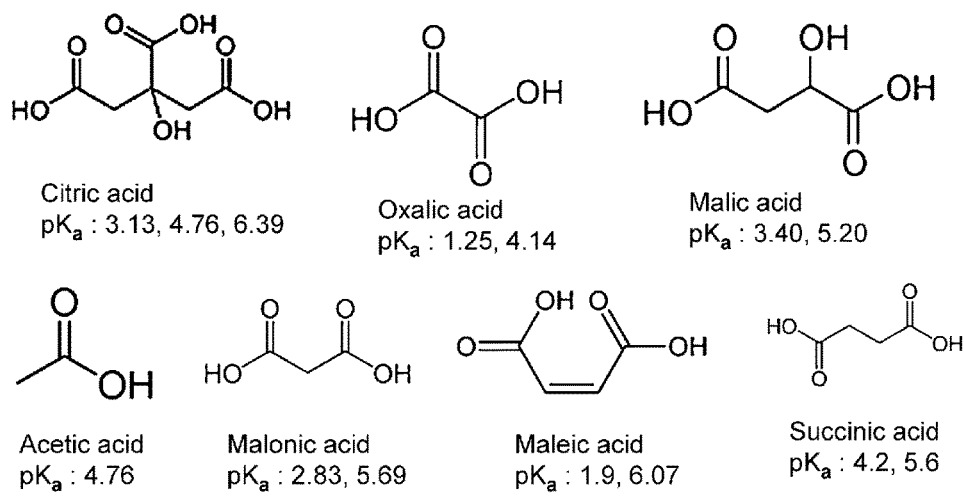
FIG. 1 illustrates chemical formulae of organic acids used in a slurry of an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

A slurry according to an exemplary embodiment is a tungsten polishing slurry, wherein the slurry includes an abrasive performing polishing and a selectivity control agent controlling a polishing selectivity between tungsten and a material other than the tungsten. Also, the slurry may include a dispersant dispersing the abrasive, an oxidizer forming an oxide, and a catalyst promoting oxide formation, and the selectivity control agent may include an organic acid containing a carboxyl group.

In this case, the abrasive, the dispersant, the oxidizer, the catalyst, and the selectivity control agent may be contained in a solution. For example, the abrasive, the dispersant, the oxidizer, the catalyst, and the selectivity control agent are dispersed and distributed in water, particularly, pure water (distilled (DI) water). Also, a corrosion inhibitor may be further included to prevent the corrosion of the tungsten, and a pH adjuster may be further included to adjust the pH of the slurry. The slurry is in the form in which the abrasive is dispersed in a liquid, and an amount of each component is appropriately adjusted. The oxidizer may not be included in the slurry and may be separately prepared and added to the slurry immediately before a polishing process.

The abrasive may include abrasive particles having a positive (+) zeta potential. For example, the abrasive particles may include zirconium oxide, i.e., zirconia ($ZrO_2$) particles. The zirconia particles are in a crystalline phase and have a polyhedral shape with lattice planes. Colloidal silica mainly used as a typical abrasive is distributed with a size of approximately 40 nm to approximately 70 nm, and an average size is approximately 38.5 nm. However, zirconia particles used in the exemplary embodiment are in a crystalline phase with a monoclinic structure and have a polyhedral shape with lattice planes. Also, the zirconia particles have a size of secondary particles of approximately 350 nm or less. In this case, the zirconia particles may be uniformly and stably dispersed in the slurry. For example, the size of the zirconia secondary particles is in a range of approximately 200 nm to approximately 310 nm, and, in this case, the zirconia particles have excellent dispersion stability. Also, the abrasive may be included in an amount of approximately 0.1 wt % to approximately 10 wt % based on a total weight of the slurry. In a case in which the amount of the abrasive is less than approximately 0.1 wt %, since a polishing rate is excessively low, polishing is difficult or polishing of the tungsten is not sufficiently performed. In a case in which the amount of the abrasive is greater than approximately 10 wt %, the dispersion stability of the abrasive particles may decrease and the size of the secondary particles may excessively increase to generate scratches. In particular, the zirconia particles may be included in an amount of approximately 0.3 wt % to approximately 5 wt % and may also be included in an amount of approximately 0.4 wt % to approximately 3 wt % based on the total weight of the slurry. The reason for this is that the polishing rate of the tungsten is good and the dispersion stability is secured in the amount range of approximately 0.3 wt % to approximately 5 wt % and the polishing rate of the tungsten is better in the amount range of approximately 0.4 wt % to approximately 3 wt %. In this case, since the zirconia abrasive particles are used as the abrasive, mechanical polishing is predominantly performed in a chemical mechanical polishing process. Accordingly, the generation of dishing may be suppressed or prevented, and a typical two-step polishing process may be simplified to a single-step process.

The dispersant functions to uniformly disperse the abrasive in the slurry, and cationic, anionic, and nonionic polymer materials may be used. Also, the dispersant may adjust the zeta potential of the abrasive. That is, a cationic dispersant may increase the zeta potential of the abrasive to a positive potential, and an anionic dispersant may decrease the zeta potential of the abrasive toward a negative potential. Also, a nonionic dispersant may maintain the zeta potential of the abrasive as it is. Therefore, the zeta potential of the abrasive may be maintained as it is or may be finely adjusted toward the positive potential or negative potential depending on the dispersant included in the slurry. The cationic polymer dispersant may include at least one selected from the group consisting of polylysine, polyethylenimine, benzethonium chloride, bronidox, cetrimonium bromide, cetrimonium chloride, dimethyldioctadecylammonium chloride, tetramethylammonium hydroxide, distearyl dimethyl ammonium chloride, polydimethylamine-co-epichlorohydrin, 1,2-dioleoyl-3-trimethylammonium propane, and poly allylamine. Also, the anionic polymer dispersant may include at least one selected from the group consisting of polyacrylic acid, polycarboxylic acid, sodium dodecylbenzenesulfonate, sodium dodecyl sulfate, and sodium polystyrene sulfonate. The nonionic polymer dispersant may include at least one selected from the group consisting of polyvinyl pyrrolidone, polyethylene oxide, polyvinyl alcohol, hydroxyethyl cellulose, 2-amino-2-methyl-1-propanol, β-cyclodextrin, fructose, glucose, and galactose. The dispersant may be included in an amount of approximately 0.01 wt % to approximately 5 wt % based on the total weight of the slurry. In a case in which the amount of the dispersant is less than approximately 0.01 wt %, dispersion is not good and precipitation may occur. In a case in which the amount of the dispersant is greater than approximately 5 wt %, the dispersion stability of the slurry may be reduced due to the agglomeration of the polymer material and high ionic concentration. Also, the dispersant may be included in an amount of approximately 0.15 wt % to approximately 1 wt % and may also be included in an amount of approximately 0.3 wt % to approximately 0.7 wt % based on the total weight of the slurry. The reason for this is that the dispersion stability is good and it is more favorable to finely adjust the zeta potential of the abrasive.

The oxidizer oxidizes the surface of a polishing target, e.g., tungsten. That is, the oxidizer oxidizes the polishing target, i.e., a metallic material, to form a metal oxide layer which has a lower strength than the metal. For example, the oxidizer oxidizes tungsten to a tungsten oxide layer having a lower strength than the tungsten to facilitate the polishing of the tungsten. The oxidizer may include at least one selected from the group consisting of hydrogen peroxide ($H_2O_2$), carbamide peroxide, ammonium persulfate, ammonium thiosulfate, sodium hypochlorite, sodium periodate, sodium persulfate, potassium iodate, potassium perchlorate, and potassium persulfate. In the exemplary embodiment, hydrogen peroxide is mainly used. An amount of the oxidizer may be in a range of approximately 0.5 wt % to approximately 10 wt % based on the total weight of the slurry. In a case in which the amount of the oxidizer is less than approximately 0.5 wt %, since a tungsten oxide is not well formed, the polishing rate is low, and thus, the polishing is difficult. In a case in which the amount of the oxidizer is greater than approximately 10 wt %, since a severe reaction occurs with the catalyst, the temperature of the slurry may be increased to cause a limitation in slurry stability, and the dispersion stability and polishing efficiency may rather be reduced due to a decomposition reaction of the abrasive. In a case in which the amount of the oxidizer is in a range of approximately 1 wt % to approximately 5 wt %, high polishing rate and stability of the slurry may be secured. The oxidizer may be included in the preparation of the slurry, or the oxidizer may be separately prepared, added to, and mixed with the slurry immediately before a substrate polishing process, and the mixed slurry may then be supplied to the substrate polishing process.

The catalyst promotes the oxidation of the polishing target, e.g., tungsten. That is, since the catalyst is used, the oxidation of the surface of the tungsten is promoted, and, accordingly, the polishing rate may be increased. The catalyst causes a reaction known as "Fenton reaction" with the oxidizer, generates an OH radical, a strong oxidizer, by the Fenton reaction, and promotes the oxidation of the surface of the tungsten. Accordingly, the formation of the tungsten oxide layer is promoted to increase the polishing rate of the tungsten. A compound containing iron may be used as the catalyst. For example, the catalyst may include at least one selected from the group consisting of ammonium iron(III) sulfate, potassium ferrioxalate ($K_3Fe(C_2O_3)_3$), EDTA-Fe—Na, potassium ferricyanide, iron(III) acetylacetonate, ammonium iron(III) citrate, ammonium iron(III) oxalate, iron(III) chloride, and iron(III) nitride. In the exemplary embodiment, ammonium iron(III) sulfate was mainly used. The catalyst may be included in an amount of approximately 0.001 wt % to approximately 5 wt % based on the total weight of the slurry. In a case in which the amount of the catalyst is less than approximately 0.001 wt %, since the polishing rate is excessively low, polishing is difficult. In a case in which the amount of the catalyst is greater than approximately 5 wt %, color of the slurry may be changed and the temperature of the slurry may be increased due to the reaction with the oxidizer. The amount of the catalyst may be in a range of approximately 0.1 wt % to approximately 1 wt %. In this case, a stable slurry may be obtained while increasing the polishing rate.

The selectivity control agent increases a difference in polishing rate between the polishing target and non-target by suppressing the polishing of the material other than the polishing target. That is, the selectivity control agent controls the polishing rate of each material to improve the polishing selectivity therebetween. For example, in a case in which the tungsten is polished, the selectivity control agent increases a difference in polishing rate between the tungsten and the insulation layer by suppressing the polishing of the material other than the tungsten, such as the insulation layer, and thus, the polishing selectivity may be improved. An organic acid having at least one carboxyl group may be used as the selectivity control agent. The carboxyl group in the slurry generates a negatively charged functional group in an acidic pH region. That is, the carboxyl group (COOH) is dissociated into $COO^-$ and $OH^+$ in the acidic pH region. The dissociated $COO^-$ group may be adsorbed to at least one of the material (e.g., insulation material) other than the polishing target and the abrasive to suppress the polishing of the insulation material. For example, the dissociated $COO^-$ group may be adsorbed to at least one of the positively charged silicon oxide layer and zirconia abrasive.

In this case, an index representing a degree, to which hydrogen ions are dissociated in a functional group, e.g., carboxyl group, is pKa, and the pKa may be derived from the following reaction formula and relationship.

$$HA + H_2O \leftrightarrow A^- + H_3O^+$$

In a case in which a functional group, HA, reacts with water to be dissociated into $A^-$ and $H_3O^+$ (see the above reaction formula), a reaction quotient (Ka) may be represented by the following equation.

$$Ka = \frac{[H_3O^+][A^-]}{[HA]}$$

where [HA] is a concentration of the functional group, e.g., carboxyl group (COOH), before the dissociation, and [$A^-$] is a concentration of the dissociated functional group, e.g., $COO^-$ group. Thus, a relationship may be obtained as follows.

$$Ka = [H_3O^+]\frac{[A^-]}{[HA]}$$

-continued $$\frac{1}{[H_3O^+]} = \frac{1}{Ka} \times \frac{[A^-]}{[HA]}$$

When taking the logarithm on both sides of the above relationship, a relationship to pH is obtained as follows.

$$pH = pKa + \log\frac{[A^-]}{[HA]}$$

Thus, pKa is derived as the following equation.

$$pKa = pH - \log\frac{[A^-]}{[HA]}$$

Thus, when the pKa and the pH are the same, the concentration of the functional group before the dissociation and the concentration of the dissociated functional group are the same (pKa=pH→[HA]=[$A^-$]). When the pKa is greater than the pH, the concentration of the functional group before the dissociation is higher than the concentration of the dissociated functional group (pKa>pH→[HA]>[$A^-$]). Also, when the pKa is smaller than the pH, the concentration of the dissociated functional group is higher than the concentration of the functional group before the dissociation (pKa<pH→[HA]<[$A^-$]). Accordingly, in order to dissociate a lot of functional groups before the dissociation, a selectivity control agent having a smaller pKa value than the pH of the slurry may be used. That is, the smaller the pKa value of the selectivity control agent is, the easier the dissociation occurs. Also, the pKa value may be in plural numbers depending on a material. Thus, the selectivity control agent may have a pKa value of less than approximately 7 or a pKa value of less than approximately 5. Also, the selectivity control agent may have the plurality of pKa values and may have 3 or more pKa values. In a case in which the selectivity control agent has the plurality of pKa values, since 2 or more carboxyl groups are included and each pKa represents a different value, a sufficient amount of the dissociated $COO^-$ group may be obtained. Furthermore, in a case in which the selectivity control agent has 3 or more pKa values, since a lot of carboxyl groups is dissociated, more $COO^-$ groups may be obtained. Thus, the polishing of the insulation material may be easily suppressed.

Various organic acids may be used as the selectivity control agent, and, for example, the selectivity control agent may include at least one of acetic acid, maleic acid, succinic acid, citric acid, oxalic acid, malic acid, or malonic acid. Each organic acid may be used alone or in a mixture. A chemical formula of each organic acid is illustrated in FIG. 1. As illustrated in FIG. 1, each organic acid includes at least one carboxyl group. Also, each organic acid has a unique pKa value. For example, acetic acid has a pKa value of approximately 4.76, and maleic acid has two pKa values of approximately 1.9 and approximately 6.07, respectively. The organic acid may have only a carboxyl group as the functional group or may further have other functional groups in addition to the carboxyl group. For example, the organic acid may have a carboxyl group and a hydroxyl group (OH). An amount of the selectivity control agent may be in a range of approximately 0.1 wt % to approximately 10 wt % based on the total weight of the slurry. In a case in which the amount of the selectivity control agent is less than approximately 1 wt %, since the effect of the selectivity control agent is insufficient, high selectivity characteristics may not be obtained. In a case in which the amount of the selectivity control agent is greater than approximately 10 wt %, the polishing rate of the insulation layer may not only be reduced, but the polishing rate of the tungsten may also be significantly reduced. Thus, high selectivity may be difficult to be obtained. In a case in which the amount of the selectivity control agent is in a range of approximately 1 wt % to approximately 10 wt %, since a polishing selectivity, in which the tungsten polishing rate is divided by the insulation polishing rate, is approximately 80 or more, a high selectivity may be obtained. Also, in a case in which the amount of the selectivity control agent is in a range of approximately 3 wt % to approximately 5 wt %, since the polishing selectivity between the tungsten and the insulation layer is approximately 100 or more, a higher selectivity may be obtained.

The corrosion inhibitor may inhibit local corrosion which may occur in the surface of the polishing target, e.g., tungsten. That is, during the polishing, pits, which are caused by the partial corrosion of the surface of the tungsten, may occur, and the corrosion inhibitor may inhibit or prevent the pits. A polymer-based material may be mainly used as the corrosion inhibitor. For example, the corrosion inhibitor may include at least one of polylysine, polyethylenimine, polyvinyl pyrrolidone, polyethylene oxide, poly allylamine, polyvinyl alcohol, polyacrylic acid, or polycarboxylic acid. Also, the corrosion inhibitor may be included in an amount of approximately 0.001 wt % to approximately 0.5 wt % based on the total weight of the slurry. In a case in which the amount of the corrosion inhibitor is less than approximately 0.001 wt %, since the surface of the tungsten is not sufficiently protected, partial corrosion may occur. In a case in which the amount of the corrosion inhibitor is greater than approximately 0.5 wt %, the dispersion stability and polishing efficiency may rather be reduced due to the polymer.

Figure 2:
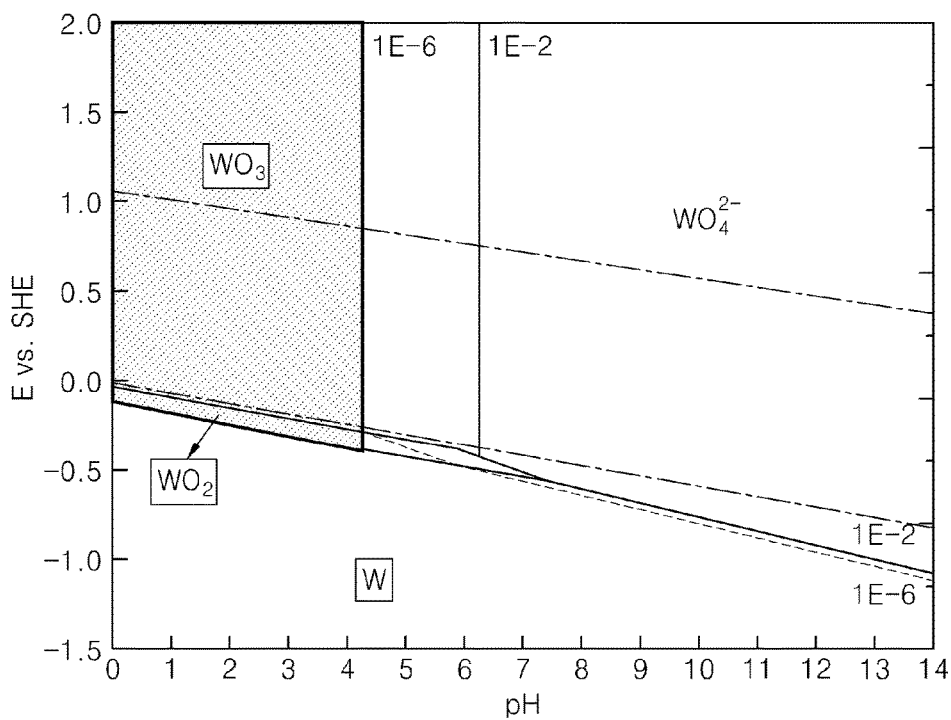
FIG. 2 is a Pourbaix diagram of tungsten.

The pH adjuster may adjust the pH of the slurry. The pH adjuster may mainly include nitric acid and ammonia water. In the exemplary embodiment, the pH adjuster is used to adjust the pH of the slurry to be acidic, i.e., less than approximately 7. Also, the pH of the slurry may be adjusted to be approximately 4 or less or may be adjusted to be in a range of approximately 2 to approximately 4. The reason for adjusting the pH may be understood with reference to FIG. 2 which illustrates a Pourbaix diagram of tungsten. Referring to FIG. 2 in which a potential with respect to the pH is illustrated, when the potential is positive (+) and the pH is greater than approximately 4, the surface of the tungsten is ionized to form $WO_4^{2-}$, and, in a case in which polishing is performed in this area, corrosion occurs on the surface of the tungsten. However, when the potential is positive (+) and the pH is approximately 4 or less (shaded area in FIG. 2), tungsten oxides ($WO_2$ and $WO_3$) softer than the surface of the tungsten are formed, and, in a case in which polishing is performed in this area, the polishing rate increases. Thus, the slurry of the exemplary embodiment may easily polish or etch the tungsten by adjusting the potential and adjusting the pH to be approximately 4 or less by using the pH adjuster such as nitric acid.

The above-described slurry for polishing tungsten of the exemplary embodiment may polish tungsten and obtain a high selectivity by the following mechanism. First, the surface of the tungsten is ionized by reacting with a ferric ion ($Fe^{3+}$) of the catalyst, and the ferric ion is reduced to be a ferrous ion ($Fe^{2+}$). The ferrous ion reacts with hydrogen peroxide ($H_2O_2$) to be oxidized into a ferric ion ($Fe^{3+}$) and oxygen ($O_2$) is formed. The oxygen reacts with the surface of the tungsten to form a soft tungsten oxide ($WO_2$), and the soft tungsten oxide ($WO_2$) reacts with oxygen to form a tungsten oxide ($WO_3$). The tungsten oxide ($WO_3$) thus formed is removed by the abrasive particles, i.e., zirconia particles, and the polishing is performed by the circulating mechanism.

Figure 3:
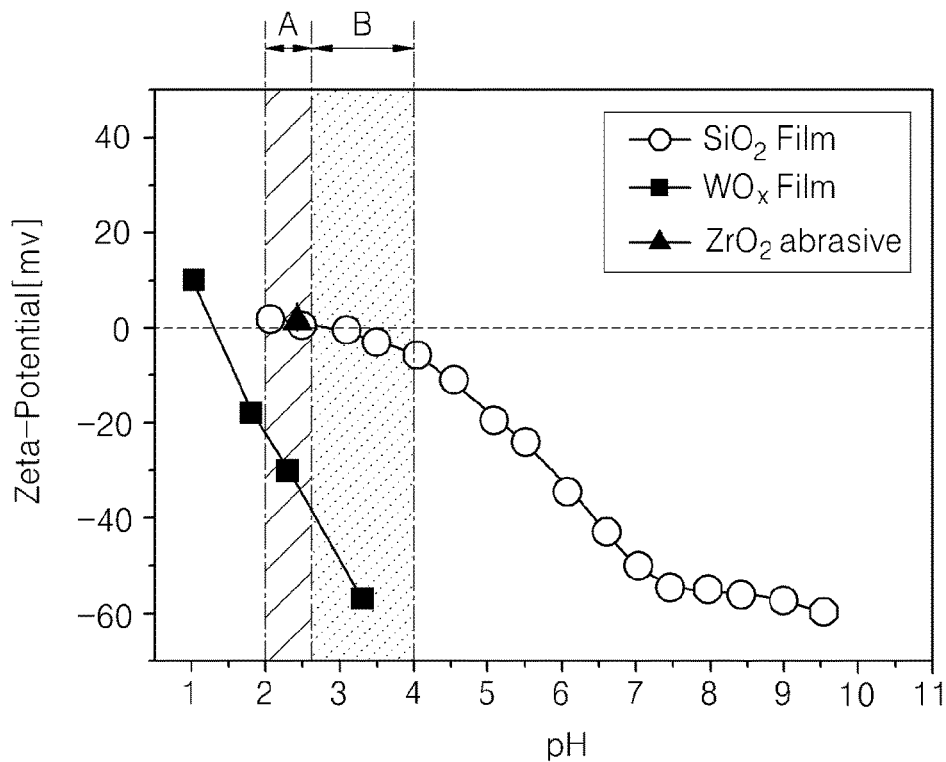
FIG. 3 is a graph illustrating zeta potentials of tungsten and a silicon oxide layer.
Figure 4:
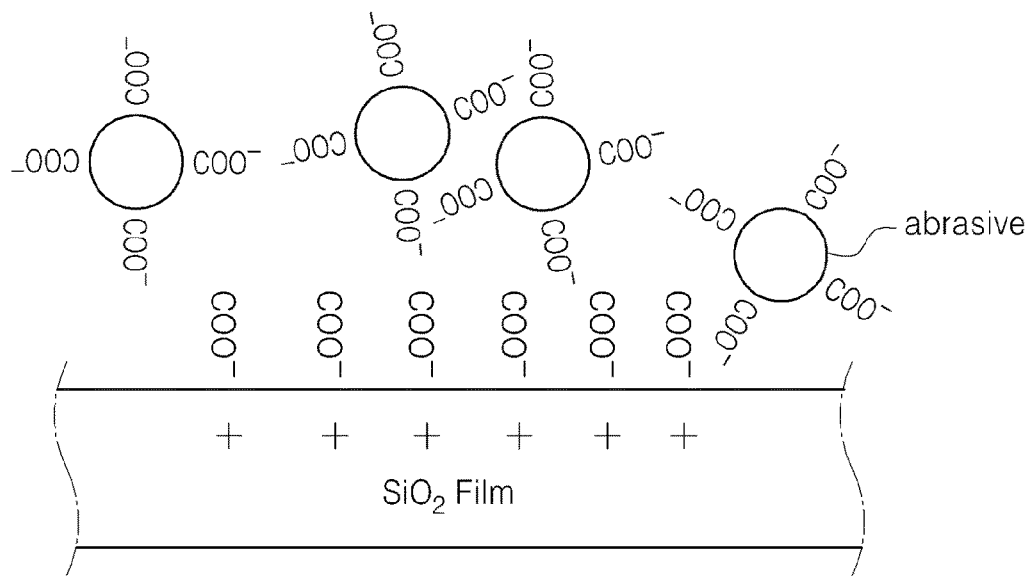
FIG. 4 is a conceptual view illustrating the action of the slurry of the exemplary embodiment in a certain acidic region.
Figure 5:
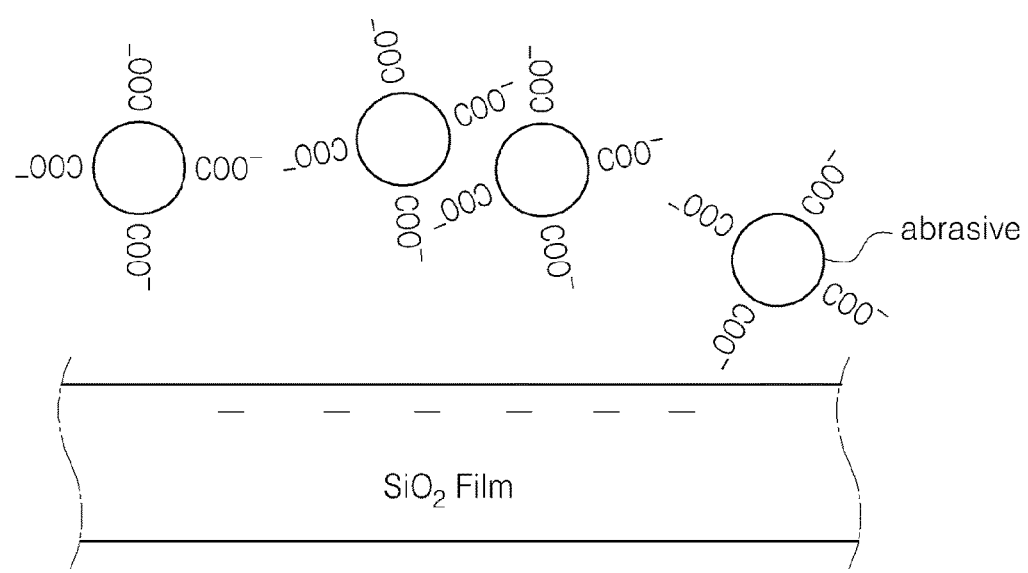
FIG. 5 is a conceptual view illustrating the action of the slurry of the exemplary embodiment in another acidic region.

As the polishing proceeds, the material other than the polishing target, e.g., a silicon oxide ($SiO_2$) layer, as the insulation layer, may be exposed in addition to the tungsten. In this case, since the polishing may also be performed on the silicon oxide by the slurry, a polished surface having desired characteristics may be obtained when the polishing of the silicon oxide is suppressed. The slurry for polishing tungsten of the exemplary embodiment may control the polishing of the silicon oxide by the selectivity control agent, specifically, the functional group contained in the selectivity control agent. This will be described in detail with reference to FIGS. 3 to 5. A case will be exemplarily described in which a tungsten layer and a silicon oxide ($SiO_2$) layer disposed thereunder are formed. FIG. 3 is a graph illustrating zeta potentials of the tungsten and silicon oxide layer, FIG. 4 is a conceptual view illustrating the action of the slurry of the exemplary embodiment in a certain acidic region, and FIG. 5 is a conceptual view illustrating the action of the slurry of the exemplary embodiment in another acidic region.

First, as illustrated in FIG. 3, when the zeta potential of each material with respect to pH is examined, when the pH is approximately 4 or less in which a tungsten oxide layer is easily formed, the tungsten oxide layer is subjected to a strong negative (−) charge, and the silicon oxide layer is subjected to a weak positive (+) charge or weak negative (−) charge. For example, when the pH is in a range of approximately 2 to approximately 4, the tungsten oxide layer has a zeta potential value of approximately −30 mV or less, and the silicon oxide layer has a zeta potential value of approximately −5 mV to approximately +5 mV. Also, the abrasive, i.e., zirconia, is subjected to a weak positive charge in the entire range. That is, the zirconia has a zeta potential value of approximately 1 mV to approximately 4 mV. When other functional groups are combined with these materials, the zeta potential value of each material may be changed. Also, in the selectivity control agent in the slurry, the carboxyl group is dissociated to form $COO^-$ and $H^+$. Accordingly, when a polishing process is performed in an area (area A of FIG. 3) in which it is strongly acidic (pH=approximately 2 to 2.6) and the silicon oxide layer is subjected to a weak positive charge, the $COO^-$ groups are adsorbed to the silicon oxide layer and zirconia particles as illustrated in FIG. 4, and, as a result, contacts between the silicon oxide layer and the zirconia abrasive particles are prevented to suppress the polishing of the silicon oxide layer and tungsten. In particular, the polishing of the silicon oxide layer is efficiently suppressed. Also, when the polishing process is performed in an area (area B of FIG. 3) in which it is acidic (pH=approximately 2.6 to 4) and the silicon oxide layer is subjected to a weak negative charge, the $COO^-$ groups are adsorbed to the positively charged zirconia particles as illustrated in FIG. 5, and, as a result, electrostatic repulsion between the silicon oxide layer and the zirconia abrasive particles, to which the $COO^-$ groups are adsorbed, occurs due to the same charge to prevent contacts therebetween. Thus, the polishing of the silicon oxide layer is suppressed.

Hereinafter, results of preparing the slurry of the exemplary embodiment and evaluating polishing characteristics by applying the slurry to a semiconductor substrate will be described.

Experimental Example

Since a preparation process of the slurry is not significantly different from a typical slurry preparation process, the preparation process of the slurry will be briefly described. First, a vessel for preparing a slurry was prepared, desired amounts of ultra pure water (DI water) and polyacrylic acid, as a dispersant, were added to the vessel and sufficiently mixed, and a predetermined amount of zirconia particles having a crystalline phase and a predetermined average primary particle size, as an abrasive, was measured, added, and uniformly mixed. A predetermined amount of ammonium iron(III) sulfate was added as a catalyst to the vessel and uniformly mixed. Also, a predetermined amount of malic acid was added as a selectivity control agent to the vessel and uniformly mixed. Subsequently, a pH value was adjusted by adding a pH adjuster, such as nitric acid, to the vessel. Hydrogen peroxide was added as an oxidizer to the vessel immediately before polishing and was uniformly mixed to prepare a slurry for tungsten. Addition and mixing sequences of each of the materials are not particularly limited. In the present experimental example, the zirconia particles and the dispersant were added to be respectively included in amounts of approximately 1 wt % and approximately 0.375 wt % based on a total weight of the slurry, the catalyst was added to be included in an amount of approximately 0.05 wt % based on the total weight of the slurry, and the oxidizer was added to be included in an amount of approximately 1.5 wt %. Also, the selectivity control agent was added in various amounts ranging from approximately 0 wt % to approximately 10 wt %. That is, a plurality of slurries was prepared according to the amount of the selectivity control agent added. The pH of each slurry was allowed to be approximately 2.3 by using nitric acid. Unavoidable impurities and pure water may be included as a remainder except for the above components.

Also, a plurality of 12 inch wafers was prepared in which polishing was performed by using the slurries of the experimental example. That is, an oxide layer and titanium nitride were respectively deposited on a silicon wafer to a thickness of approximately 1,000 Å and a tungsten layer was then deposited to a thickness of approximately 6,000 Å to prepare a tungsten wafer. Also, an oxide layer wafer was prepared in which a silicon oxide layer was deposited as an insulation layer to a thickness of approximately 7,000 Å. Poli-762 equipment by G&P Tech was used as polishing equipment, and an IC 1000/Suba IV CMP pad by Rohm & Haas was used as a polishing pad. Also, the tungsten layer and the oxide layer were respectively polished for approximately 60 seconds under the following polishing condition. A head pressure was approximately 4 psi, speeds of a head and a spindle table were respectively approximately 93 rpm and approximately 87 rpm, and a flow rate of the slurry was approximately 100 ml/min.

Figure 7:
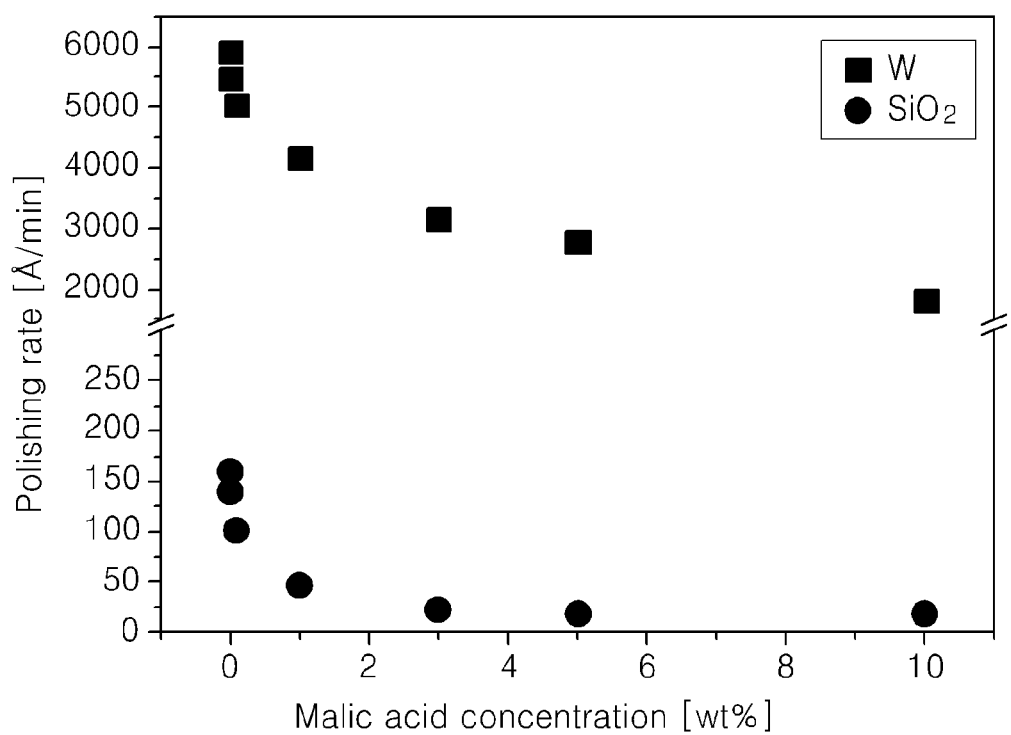
FIG. 7 is a graph illustrating polishing rates of the tungsten and the oxide layer depending on the concentration of a selectivity control agent.

FIG. 6 is a table showing results of polishing by using the slurry of the exemplary embodiment, and FIG. 7 is a graph illustrating polishing rates of the tungsten and the oxide layer depending on the concentration of the selectivity control agent. In FIG. 6, the polishing rates and selectivities of the tungsten and oxide layer depending on the amount of the selectivity control agent were expressed as numerical values, and FIG. 7 illustrates the polishing rates of the tungsten and the silicon oxide layer, respectively. Herein, the polishing rates of the tungsten and the silicon oxide layer were calculated by respectively polishing the tungsten wafer and the silicon oxide layer wafer, and the polishing selectivity was a ratio of the polishing rate of the tungsten to the polishing ratio of the oxide layer. That is, the polishing selectivity was a value in which the tungsten polishing rate was divided by the silicon oxide layer polishing rate.

As illustrated in FIGS. 6 and 7, when the amount of the selectivity control agent was increased, the polishing rates of both tungsten and silicon oxide layer were reduced. However, since there was a more reduction in the polishing rate of the silicon oxide layer, a high polishing selectivity may be obtained. Principle related thereto was already described. In a case in which the amount of the selectivity control agent was in a range of approximately 0.1 wt % to approximately 10 wt %, the polishing selectivity was high at approximately 50 or more. Also, in a case in which the amount of the selectivity control agent was in a range of approximately 1 wt % to approximately 10 wt %, the polishing selectivity was very high at approximately 80 or more. When the amount of the contained selectivity control agent was approximately 10 wt % or more, a reduction in the polishing rate of the tungsten began to increase. In a case in which the amount of the selectivity control agent was in a range of approximately 1 wt % to approximately 5 wt %, the polishing selectivity was very high at approximately 80 or more and the polishing rate of the tungsten was also very high at approximately 2,500 or more.

The slurry according to the exemplary embodiment may be used in a polishing process of tungsten in a manufacturing process of a semiconductor device. Tungsten may be used in a buried gate and an interconnection/plug. With respect to the buried gate tungsten, a spacing between cells was small at approximately 30 nm or less, and, with respect to the tungsten for the interconnection/plug, a spacing between cells was relatively large, ranging from approximately 30 nm to approximately 150 nm. Thus, a polishing process may be performed by selecting a slurry having an appropriate polishing selectivity according to the type of pattern to be polished. That is, a slurry having a high selectivity, in which the polishing selectivity between the tungsten layer and the oxide layer is high, may be used in the manufacturing process of the semiconductor device. A method of manufacturing a semiconductor device using the slurry according to the exemplary embodiment will be described with reference to FIGS. 8A-8D below.

Figure 8A:
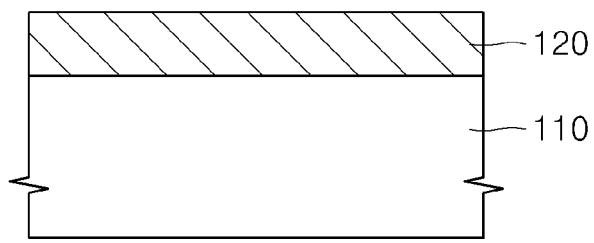
FIGS. 8A-8D are cross-sectional view illustrating a method of manufacturing a semiconductor device according to an exemplary embodiment.
Figure 8B:
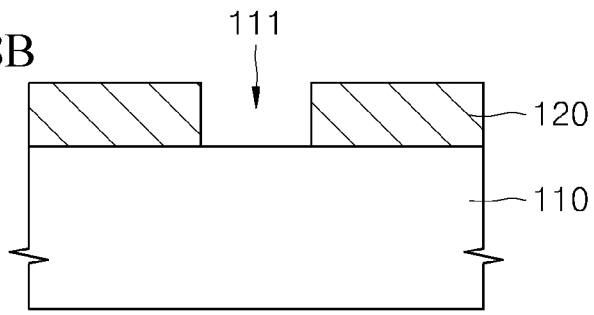

FIGS. 8A-8D are cross-sectional views illustrating a method of manufacturing a semiconductor device according to an exemplary embodiment. Referring to FIG. 8A, an insulation is formed on a substrate 110. Referring to FIG. 8B, a predetermined region of the insulation layer 120 is etched to form a pattern which exposes a predetermined region 111 of the substrate 110. Various substrates used in the manufacture of a semiconductor device may be used as the substrate 110, wherein a silicon substrate may be used. The insulation layer 120 may be formed by using a silicon oxide-based material. For example, the insulation layer 120 may be formed by using at least one of Boron PhosphoSilicate Glass (BPSG), PhosphoSilicate Glass (PSG), High Density Plasma (HDP), Tetra Ethyl Ortho Silicate (TEOS), Undoped Silica Glass (USG), PETEOS, or a High Aspect Ratio Process (HARP). Also, the insulation layer 120 may be formed by a Physical Vapor Deposition (PVD) method, a Chemical Vapor Deposition (CVD) method, a Metal Organic CVD (MOCVD) method, an Atomic Layer Deposition (ALD) method, or an AL-CVD method in which the CVD method and the ALD method are mixed. The pattern may be a hole which exposes a predetermined region of the substrate 110 to form an interconnection and/or a plug, or may be a line-shaped trench.

Figure 8C:
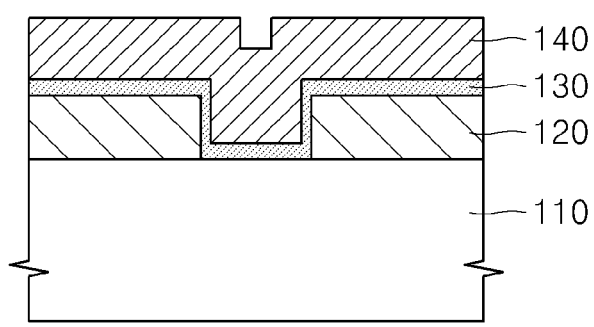

As illustrated in FIG. 8C, a barrier layer 130, such as titanium nitride, is formed on the insulation layer 120 and the substrate 110 including the pattern, and a tungsten layer 140 is then formed so as to bury the pattern.

Figure 8D:
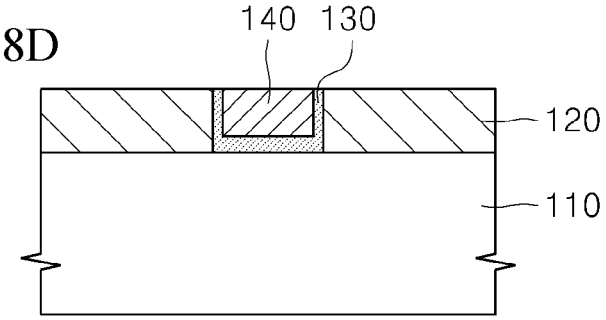

Referring to FIG. 8D, the tungsten layer 140 and the insulation layer 120 are polished by using the slurry having a high selectivity in which the polishing selectivity between the tungsten layer and the oxide layer is high. The slurry has a high selectivity in which the polishing selectivity between the tungsten layer and the oxide layer is high at approximately 50 or more. In this case, a zeta potential of the initial slurry, i.e., a zeta potential of the initial abrasive, is approximately 3 mV. That is, with respect to a polishing method in this case, a slurry, which includes zirconium oxide particles, as an abrasive, and a selectivity control agent containing a carboxyl group, is prepared, and the tungsten layer is polished while supplying the slurry to the substrate. In such a polishing process, a functional group generated by the dissociation of the carboxyl group may suppress the polishing of a material other than the tungsten layer, i.e., the silicon oxide layer 120. The polishing process is performed in an acidic pH region and includes a process of forming a tungsten oxide layer on a top surface of the tungsten layer 140 and polishing the tungsten oxide layer with the zirconia abrasive, and a process of generating a COO⁻ group by the dissociation of the carboxyl group in the slurry. The generated COO⁻ group may suppress the polishing of the insulation layer 120 as described above and may provide a high selectivity. When the tungsten layer 140 is polished by using the slurry having a high selectivity, the insulation layer 120 is not polished and the tungsten layer 140 is polished. Thus, erosion hardly occurs. In this case, since the zirconia particles are used as an abrasive, a CMP process may be performed in which mechanical polishing is predominant Thus, dishing may also be suppressed. Also, in comparison with the fact that a typical tungsten CMP process is performed in multiple stages, since a single CMP process may be performed in the exemplary embodiment, the process may be simplified to improve productivity. Thus, the slurry having a high selectivity is suitable for polishing a buried tungsten layer.

Although the polishing slurry and method of polishing substrate using the same have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. A slurry for polishing tungsten, the slurry comprising:
   an abrasive configured to perform polishing and include particles having a positive zeta potential;
   a dispersant configured to disperse the abrasive;
   an oxidizer configured to oxidize tungsten;
   a catalyst configured to promote oxidation of tungsten;
   a selectivity control agent configured to control a polishing selectivity between tungsten and a material other than tungsten, and includes an organic acid containing a carboxyl group; and
   a pH adjuster configured to adjust a pH value of the slurry so that a functional group generatable by a carboxyl group of the selectivity control agent is adsorbable to at least one of the abrasive and the material other than tungsten.

2. The slurry for polishing tungsten of claim 1, wherein the abrasive comprises zirconium oxide particles and is included in an amount of approximately 0.1 wt % to approximately 10 wt % based on a total weight of the slurry.

3. The slurry for polishing tungsten of claim 2, wherein the abrasive comprises zirconium oxide particles and is included in an amount of approximately 0.4 wt % to approximately 3 wt % based on the total weight of the slurry.

4. The slurry for polishing tungsten of claim 1, wherein the dispersant is included in an amount of approximately 0.01 wt % to approximately 5 wt % based on a total weight of the slurry.

5. The slurry for polishing tungsten of claim 4, wherein the dispersant is included in an amount of approximately 0.15 wt % to approximately 1 wt % based on the total weight of the slurry.

6. The slurry for polishing tungsten of claim 1, wherein the oxidizer is included in an amount of approximately 0.5 wt % to approximately 10 wt % based on a total weight of the slurry.

7. The slurry for polishing tungsten of claim 6, wherein the oxidizer is included in an amount of approximately 1.0 wt % to approximately 5.0 wt % based on the total weight of the slurry.

8. The slurry for polishing tungsten of claim 6, wherein the catalyst is included in an amount of approximately 0.001 wt % to approximately 5 wt % based on the total weight of the slurry.

9. The slurry for polishing tungsten of claim 8, wherein the catalyst is included in an amount of approximately 0.01 wt % to approximately 1 wt % based on the total weight of the slurry.

10. The slurry for polishing tungsten of claim 1, wherein the selectivity control agent is included in an amount of approximately 0.1 wt % to approximately 10 wt % based on a total weight of the slurry.

11. The slurry for polishing tungsten of claim 10, wherein the selectivity control agent is included in an amount of approximately 1 wt % to approximately 10 wt % based on the total weight of the slurry.

12. The slurry for polishing tungsten of claim 1, wherein the functional group generatable by the carboxyl group is negatively charged in an acidic region.

13. The slurry for polishing tungsten of claim 12, wherein the selectivity control agent has a pKa value, which is an index representing a degree to which hydrogen ions are dissociated in a carboxyl group, of less than approximately 7.

14. The slurry for polishing tungsten of claim 13, wherein the selectivity control agent has the plurality of pKa values.

15. The slurry for polishing tungsten of claim 14, wherein the selectivity control agent has 3 or more pKa values.

16. The slurry for polishing tungsten of claim 10, wherein the selectivity control agent comprises at least one of acetic acid, maleic acid, succinic acid, citric acid, oxalic acid, malic acid, or malonic acid.

17. A slurry for polishing tungsten, the slurry comprising:
    zirconium oxide particles as an abrasive configured to perform polishing; and
    a selectivity control agent configured to control a polishing selectivity between tungsten and a material other than tungsten,
    wherein the selectivity control agent comprises an acid which is dissociated in an acidic region to generate a COO⁻ functional group, and a pH adjuster configured to adjust a pH value of the slurry so that the COO⁻ functional group of the selectivity control agent is adsorbable to at least one of the abrasive and the material other than tungsten.

18. The slurry for polishing tungsten of claim 17, wherein the material other than tungsten comprises an insulation material.

19. The slurry for polishing tungsten of claim 18, further comprising:
   an oxidizer configured to oxidize tungsten; and
   a catalyst configured to promote oxidation of tungsten,
   wherein, in an acidic region, tungsten in an oxidized state is negatively charged, the insulation material is positively charged, and the COO⁻ functional group is allowed to be adsorbed to the insulation layer.

* * * * *